United States Patent [19]
Kim

[11] Patent Number: 5,893,026
[45] Date of Patent: Apr. 6, 1999

[54] LOW PASS FILTER FOR SUPPRESSING HARMONIC OF RADIO TRANSMITTER

[75] Inventor: Wook Kim, Seoul, Rep. of Korea

[73] Assignee: SamSung Electronics Co., Ltd., Suwon, Rep. of Korea

[21] Appl. No.: 777,763

[22] Filed: Dec. 30, 1996

[30] Foreign Application Priority Data

Dec. 28, 1995 [KR] Rep. of Korea ................. 1995/61236

[51] Int. Cl.$^6$ ....................................................... H04B 1/04
[52] U.S. Cl. ........................... 455/114; 455/95; 455/296; 333/114
[58] Field of Search ................................. 455/114, 91, 95, 455/104, 105, 107, 116, 315, 295, 296, 327; 333/168, 114, 117, 124, 78, 82, 83, 84

[56] References Cited

U.S. PATENT DOCUMENTS

| | | |
|---|---|---|
| 3,787,771 | 1/1974 | O'Connor .................................. 455/63 |
| 3,832,626 | 8/1974 | Stut ............................................. 323/4 |
| 4,429,338 | 1/1984 | Becker et al. ............................. 361/42 |
| 4,631,232 | 12/1986 | Pitel ........................................... 363/71 |
| 5,245,433 | 9/1993 | Sid-Ahmed et al. .................... 358/160 |
| 5,465,396 | 11/1995 | Hunsinger et al. ...................... 455/102 |
| 5,517,532 | 5/1996 | Reymond ................................. 375/354 |
| 5,530,922 | 6/1996 | Nagode .................................... 455/126 |
| 5,574,993 | 11/1996 | Kobayashi et al. ..................... 455/126 |

*Primary Examiner*—Reinhard J. Eisenzopf
*Assistant Examiner*—Edan Orgad
*Attorney, Agent, or Firm*—Robert E. Bushnell, Esq.

[57] ABSTRACT

A low pass filter capable of passing a radio paging signal of good quality through suppressing harmonic in a radio paging transmitter. The low pass filter of the radio paging transmitter, comprising: a first filter of a π type for suppressing harmonic of a radio paging signal outputted, which is connected to an output terminal of the radio paging transmitter; and, a second filter for suppressing second and third harmonic or more of the radio paging signal, which is connected between the first filter and an antenna and comprised with multistage plane panel capacitors and parallel inductance and capacitors connected between the plane panel capacitors.

19 Claims, 1 Drawing Sheet

LOW PASS FILTER FOR SUPPRESSING HARMONIC OF RADIO TRANSMITTER

BACKGROUND OF THE INVENTION

1. Field of the Invention

The present invention relates to a low pass filter of a radio transmitter and, in particular, a low pass filter capable of attenuating harmonic and spurious frequency.

2. Description of the Related Art

As radio paging subscribers are presently increasing, a paging system for transmitting radio paging data is also extended in correspondence with the above increase. While the paging system provides paging data signals of good quality for subscribers, a paging transmitter (hereinafter, referred to as a transmitter) converts the paging data signal into a radio frequency RF signal and transmits the converted signal. At this time, an electronic feature of the transmitter determines quality of radio paging service thereof.

Therefore, generation of harmonic and spurious frequency in a radio paging frequency band can deteriorate the quality of the paging service of the transmitter. Generally, in order to suppress the generation of the harmonic and the spurious frequency, the transmitter uses a number of filters between a signal source and a termination outputting signal. For instance, a low pass filter using a general capacitor can be used in order to suppress the harmonic generation in the transmitter. However, a common low pass filter can be embodied as an elliptic low pass type filter capable of diminishing cost by reducing the number of components of the above low pass filter because of having a limit in a space where the components are mounted.

In this case, even if the above elliptic low pass type filter can diminish cost by reducing the number of components thereof, it has a reduced capability of suppressing and attenuating the generation of the fifth harmonic or more.

SUMMARY OF THE INVENTION

It is therefore an object of the present invention to provide a low pass filter capable of passing a radio paging signal of good quality by suppressing harmonics in a radio paging transmitter.

To achieve the above and other objects, a low pass filter of a radio paging transmitter comprises: a first filter of a π type for suppressing harmonic of a radio paging signal outputted, which is connected to an output terminal of the radio paging transmitter; and, a second filter for suppressing the second or third harmonic or more of the radio paging signal, which is connected between the first filter and an antenna which is provided with multistage plane panel capacitors and parallel inductance and capacitors PLCs connected between the plane panel capacitors.

BRIEF DESCRIPTION OF THE DRAWINGS

These and various other features and advantages of the present invention will be readily understood with reference to the following detailed description taken in conjunction with the accompanying drawings, wherein.

DETAILED DESCRIPTION OF THE INVENTION

In the following description, numeral specific details such as components and frequencies of the concrete circuit, are set forth to provide a more through understanding of the present invention. It will be apparent, however, to one skilled in the art that the present invention may be practiced without these specific details. The detailed description of known function and constructions unnecessarily obscuring the subject matter of the present invention will be avoided in the present invention.

Figure 1:
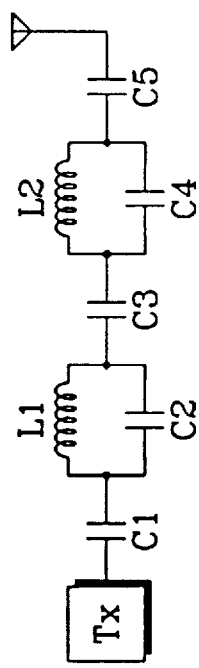
FIG. 1 is a view illustrating construction of a low pass filter using a general capacitor; and, FIG. 2 is a view illustrating construction of a low pass filter for suppressing harmonic according to the present invention.

FIG. 1 is a view illustrating construction of a low pass filter using a general capacitor. For instance, a low pass filter using a general capacitor can be used in order to suppress the harmonic generation in the transmitter. However, a common low pass filter can be embodied as an elliptic low pass type filter capable of diminishing cost by reducing the number of components of the above low pass filter because of having a limit in a space where the components are mounted.

Figure 2:
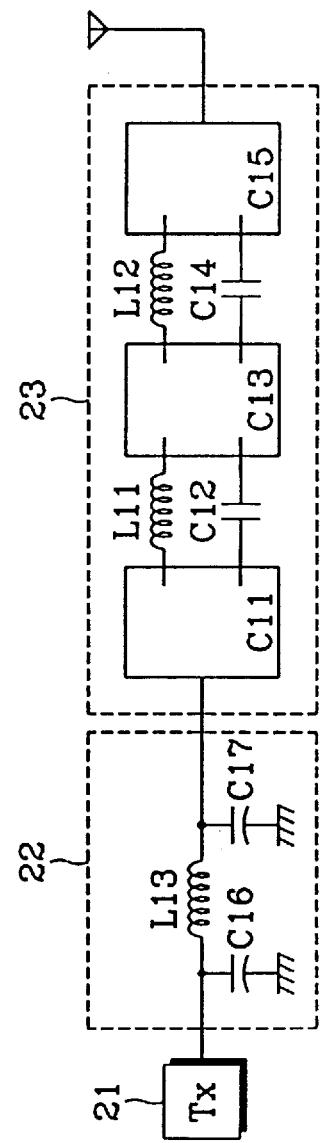

FIG. 2 is a view illustrating construction of a low pass filter for suppressing harmonic according to the present invention. As illustrated in FIG. 2, a transmission terminal Tx may be an output terminal of a radio paging transmitter 21. Capacitors C16 and C17, and a coil L13 become a first filter as a π type LC filter 22 connected to the transmission terminal Tx. The first filter 22 performs the function of attenuating the fifth harmonic or more included in a radio paging signal outputted in the transmission terminal Tx. An elliptic low-pass filter 23 is provided with a first plane panel capacitor C11, a second plane panel capacitor C13, a third plane panel capacitor C15, and a parallel inductance and capacitor (hereinafter, referred to as PLC) connected between the above plane panel capacitors C11, C13, and C15. The elliptic low pass filter 23 as a second filter performs the function of suppressing the second or third harmonic included in the radio paging signal.

Generally, the filter forms an LC circuit provided with coils and capacitors and reduces high frequency of a transmitter or extracts a desired band signal of a frequency converter. Therefore, the function of the filter as described above plays an important role in determining performance of radio instruments. Herein, the low pass filter passes a signal under a cut off frequency but does not pass a signal over the cut off frequency.

In the present invention, the elliptic low pass filter 23, as shown in FIG. 2, is provided with: three plane panel capacitors C11, C13, and C15; and PLCs comprising a coil L11 and a capacitor 12, and a coil L12 and a capacitor C14, wherein the PLCs are connected between the plane panel capacitors, respectively. The filter 23 is designed to allow upon insertion, an input signal up to a maximum of 0.2 dB in a pass band (320 MHz–330 MHz), and to attenuate the signal by 50 dB or more in a second harmonic band (640 MHz–660 MHz) and a third harmonic band (960 MHz–990 MHz). At this time, return loss of the filter 23 reaches up to 25 dB or more so that its load and its match can be greatly performed.

Therefore, the elliptic low pass filter 23 has the same construction as that of FIG. 1 to gain the second harmonic attenuation and the third harmonic attenuation up to 50 dB or more in a frequency band (320 MHz–330 MHz). As a result of experiment on the feature of the filter 23 through use of a network analyzer, the feature of attenuating the fifth harmonic or more can be deteriorated. In order to attenuate the fifth harmonic or more, the present invention adds the π type LC filter 22 to a front terminal of the elliptic low pass filter 23.

As mentioned above, FIG. 2 is a view illustrating construction of the low pass filter for suppressing the harmonic according to the present invention. As illustrated in FIG. 2, the plane panel capacitors C11, C13, and C15 are designed by use of a printed circuit board PCB (Teflon PCB of permittivity $\epsilon\gamma=2.5$). The plane panel capacitors C11, C13, and C15 are determined as follows.

$$C(pF) = \frac{0.0884 * \epsilon\gamma * A}{d}$$

Herein,
$\epsilon\gamma$=permittivity of the used PCB,
d=thickness of the PCB, and
A=area(cm$^2$).

In addition, the coils L11 and L12 are embodied with an air coil. The coils L11 and L12 are determined as follows.

$$L = \frac{0.394\gamma^2 * N^2}{9\gamma + 10l}$$

Herein,
$\gamma$=radius of the coil(cm),
l=length of the coil(cm), and
L=inductance($\mu$H).

As mentioned above, the present invention can adjust attenuation of the second and the third harmonic through design of the plane panel capacitors and the coils.

As mentioned previously, the present invention has an advantage in that the second, the third, and the fifth harmonic or more of the radio paging transmitter are attenuated by 50 dB or more by application of the low pass filter for suppressing the harmonic and, in particular, and by use of the plane panel capacitors which make it is possible to prevent deterioration of components through heat generated by radio frequency RF power transfer.

What is claimed is:

1. A low pass filter of radio paging transmitter, comprising:
   a first filter of a $\pi$ type connected to an output terminal of said radio paging transmitter for suppressing at least one harmonic of a radio paging signal output; and
   a second filter connected between said first filter and an antenna and including multistage plane panel capacitors with at least one parallel inductance and at least one capacitor connected between said plane panel capacitors, for suppressing at least two additional harmonics of said radio paging signal output.

2. The low pass filter of claim 1, wherein said at least one harmonic suppressed by said first filter comprises a fifth harmonic of an operating frequency band of said radio paging transmitter.

3. The low pass filter of claim 2, wherein said at least one harmonic suppressed by said first filter comprises at least one additional harmonic greater than said fifth harmonic of said frequency band of said radio paging transmitter.

4. The low pass filter of claim 3, wherein said at least two additional harmonics suppressed by said second filter comprised a second harmonic and a third harmonic of an operating frequency band of said radio paging transmitter.

5. The low pass filter of claim 2, wherein said at least two additional harmonics suppressed by said second filter comprised a second harmonic and a third harmonic of an operating frequency band of said radio paging transmitter.

6. The low pass filter of claim 1, wherein said at least two additional harmonics suppressed by said second filter comprised a second harmonic and a third harmonic of an operating frequency band of said radio paging transmitter.

7. The low pass filter of claim 1, wherein said second filter comprises at least three multistage plane panel capacitors and plurality of inductances and capacitors, each pair of adjacent multistage plane panel capacitors being connected by at least one of said inductances and at least one of said capacitors.

8. The low pass filter of claim 7, wherein said second filter allows an input signal up to a maximum of 0.2 dB and a pass band, and attenuates a signal by at least 50 dB, and a second harmonic band and a third harmonic band.

9. The low pass filter of claim 1, wherein said second filter allows an input signal up to a maximum of 0.2 dB and a pass band, and attenuates a signal by at least 50 dB, and a second harmonic band and a third harmonic band.

10. A radio paging transmitter, comprising:
    a transmitter generating a radio paging signal output;
    first filter means for suppressing at least one harmonic of said radio paging signal output to produce a first filter output;
    second filter connected to said output of first filter between said first filter and an antenna, having means operationally responsive to said first filter output comprising a plurality of plane panel capacitors forming a multiple of stages, with an inductor and a capacitor coupled between each of said stages, for suppressing at least two additional harmonics of said radio paging signal output to produce a second filter output; and
    an antenna operationally responding to said second filter output by transmitting an antenna output.

11. The radio paging transmitter of claim 10, wherein said first filter means comprises a $\pi$ type filter connected to an output terminal of said radio paging transmitter.

12. The radio paging transmitter of claim 10, wherein said second filter means comprises an elliptic filter connected between said first filter means and said antenna.

13. The radio paging transmitter of claim 12, wherein said elliptic filter said inductor and said capacitor connected in parallel between said plane panel capacitors.

14. The radio paging transmitter of claim 10, wherein said at least one harmonic suppressed by said first filter means comprises a fifth harmonic of an operating frequency band of said radio paging transmitter.

15. The radio paging transmitter of claim 10, wherein said at least one harmonic suppressed by said first filter means comprises a fifth harmonic and at least one higher harmonic of said operating frequency band of said radio paging transmitter.

16. The radio paging transmitter of claim 10, wherein said at least two additional harmonics suppressed by said second filter means a second harmonic and a third harmonic of an operating frequency band of said radio paging transmitter.

17. The radio paging transmitter of claim 14, wherein said at least two additional harmonics suppressed by said second filter means comprise a second harmonic and a third harmonic of an operating frequency band of said radio paging transmitter.

18. The radio paging transmitter of claim 15, wherein said at least two additional harmonics suppressed by said second filter means comprise a second harmonic and a third harmonic of an operating frequency band of said radio paging transmitter.

19. A radio paging transmitter comprising:
    a first filter of a $\pi$ suppressing at least one harmonic of a radio paging signal output by said radio paging transmitter; and
    second filter connected to said output of first filter between said first filter and an antenna, comprising at least three multistage plane panel capacitors and plurality of inductances and capacitors, each pair of adjacent multistage plane panel capacitors being connected by at least one of said inductances and at least one of said capacitors, suppressing a sound harmonic and a third ha of an operating frequency band of said radio paging transmitter.

* * * * *